(12) United States Patent
Ruda Y Witt et al.

(10) Patent No.: US 9,447,500 B2
(45) Date of Patent: Sep. 20, 2016

(54) CVD REACTOR HAVING A SUBSTRATE HOLDER RESTING ON A GAS CUSHION COMPRISING A PLURALITY OF ZONES

(75) Inventors: Francisco Ruda Y Witt, Eschweiler (DE); Johannes Käppeler, Würselen (DE)

(73) Assignee: Aixtron SE, Herzogenrath (DE)

( * ) Notice: Subject to any disclaimer, the term of this patent is extended or adjusted under 35 U.S.C. 154(b) by 750 days.

(21) Appl. No.: 13/502,356

(22) PCT Filed: Oct. 8, 2010

(86) PCT No.: PCT/EP2010/065105
§ 371 (c)(1),
(2), (4) Date: Apr. 16, 2012

(87) PCT Pub. No.: WO2011/045241
PCT Pub. Date: Apr. 21, 2011

(65) Prior Publication Data
US 2012/0204796 A1     Aug. 16, 2012

(30) Foreign Application Priority Data

Oct. 16, 2009   (DE) .................... 10 2009 044 276

(51) Int. Cl.
| C23C 16/458 | (2006.01) |
| C23C 16/46 | (2006.01) |
| C23C 16/48 | (2006.01) |

(52) U.S. Cl.
CPC ......... *C23C 16/458* (2013.01); *C23C 16/4583* (2013.01); *C23C 16/4584* (2013.01); *C23C 16/4586* (2013.01); *C23C 16/46* (2013.01); *C23C 16/481* (2013.01)

(58) Field of Classification Search
CPC .......... C23C 16/4585; C23C 16/4586; C23C 16/4581; C23C 16/4583; C23C 14/505; C23C 16/4584; H01L 21/68735; H01L 21/68792; C30B 25/12; C30B 25/14

USPC ........ 118/728, 730, 729; 156/345.54, 345.55
See application file for complete search history.

(56) References Cited

U.S. PATENT DOCUMENTS 4,860,687 A * 8/1989 Frijlink .................... 118/500
5,033,538 A * 7/1991 Wagner et al. .......... 165/80.1
(Continued)

FOREIGN PATENT DOCUMENTS

| DE | 102006018514 A1 | 10/2007 |
| DE | 102007026348 A1 | 12/2008 |
| WO | 03/008675 A1 | 1/2003 |

OTHER PUBLICATIONS

ISR of PCT/EP2010/065105; Nov. 30, 2010; 8 pages.
Amendment received before examination dated Sep. 27, 2012, EP Application No. 10763691.1, (5 pages).
Decision to grant European U.S. Pat. No. 2,488,679 dated Oct. 30, 2014, EP Application No. 10763691.1, (2 pages).
(Continued)

*Primary Examiner* — Jeffrie R Lund
*Assistant Examiner* — Mirza Israr Javed
(74) *Attorney, Agent, or Firm* — Ascenda Law Group, PC

(57) ABSTRACT

The invention relates to a CVD reactor having a process chamber (23) and a substrate holder support (1) arranged therein, said support comprising at least one bearing surface (4), wherein a plurality of gas inlet lines (7, 8) open out into the bearing surface (4'). The CVD reactor further has a substrate holder (2), the back side thereof facing the bearing surface (4'), wherein the gases fed through the gas inlet lines (7,8) into the space between the bearing surface (4') and back side form a gas cushion (19) supporting the substrate holder (2). According to the invention, the gas cushion comprises a plurality of zones (A, C) that each can be fed through an associated gas inlet line (7, 8) and that are separated from each other by a means (15) preventing gas exchange between the zones (A, C). At least one inner zone (C) is associated with a gas discharge line (13, 14), via which the gas fed into the inner zone (C) by way of the inlet line (7, 8) can be discharged. Gases having different heat conduction properties are fed into the zones.

7 Claims, 12 Drawing Sheets

(56) References Cited

U.S. PATENT DOCUMENTS

| | | | |
|---|---|---|---|
| 5,177,878 | A | 1/1993 | Visser |
| 5,468,299 | A | 11/1995 | Tsai |
| 6,053,982 | A | 4/2000 | Halpin et al. |
| 6,182,602 | B1 * | 2/2001 | Redeker et al. ......... 118/723 R |
| 6,878,395 | B2 | 4/2005 | Kaeppeler |
| 7,156,951 | B1 | 1/2007 | Gao et al. |
| 2003/0033116 | A1 | 2/2003 | Brcka et al. |
| 2007/0256786 | A1 * | 11/2007 | Zhou et al. ............. 156/345.34 |
| 2008/0227227 | A1 | 9/2008 | Sundararajan |
| 2009/0110805 | A1 * | 4/2009 | Kaeppeler et al. ............. 427/8 |
| 2009/0173446 | A1 | 7/2009 | Yang et al. |

OTHER PUBLICATIONS

English Translation of International Preliminary Report on Patentability dated May 8, 2012, International Application No. PCT/EP2012/065105, (6 pages).

Filing of the translation of claims received Oct. 9, 2014, EP Application No. 10763696.1, (5 pages).

Request for entry into the European Phase (PCT/EP2010/065105) dated May 8, 2012, EP Application No. 10763691.1 (42 pages).

Text intended for grant dated Jul. 10, 2014, EP Application No. 10763696.1, (42 pages).

* cited by examiner

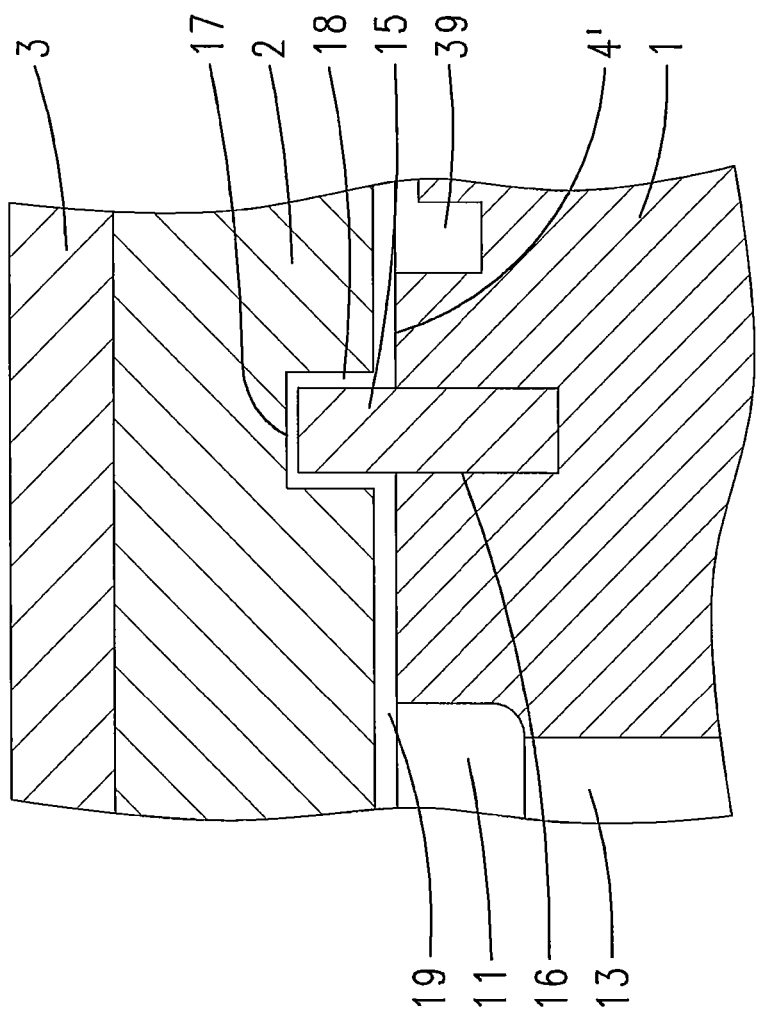

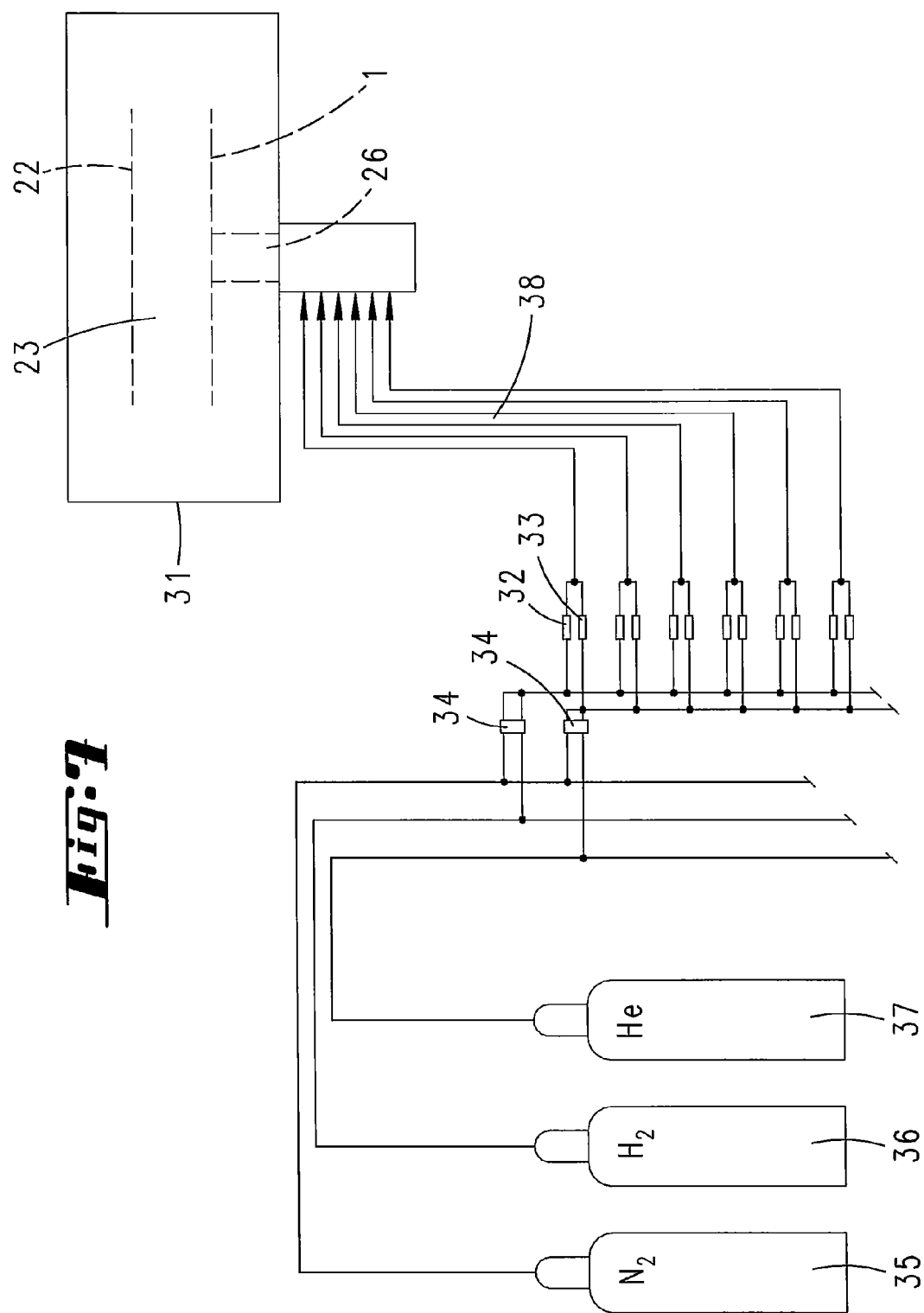

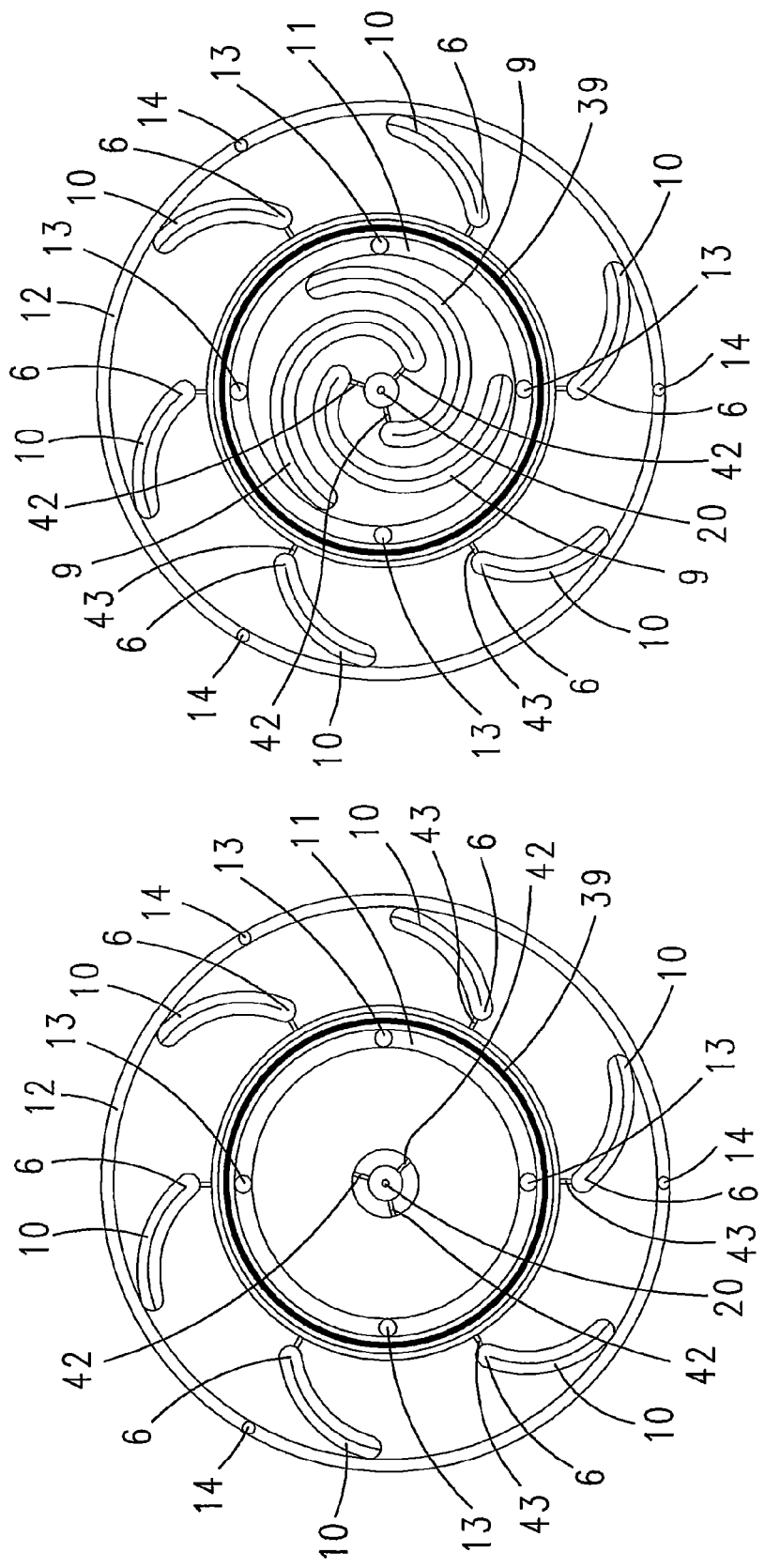

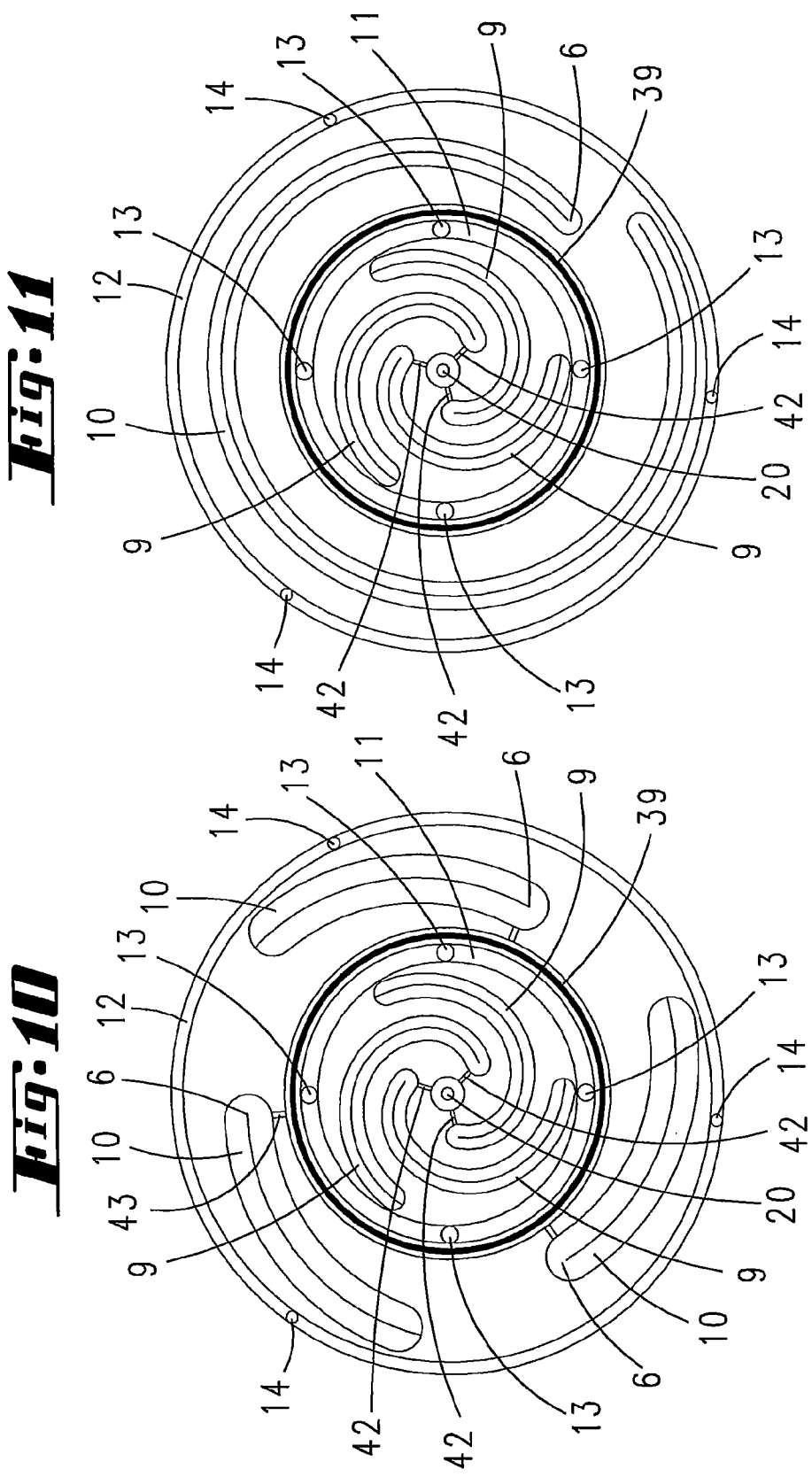

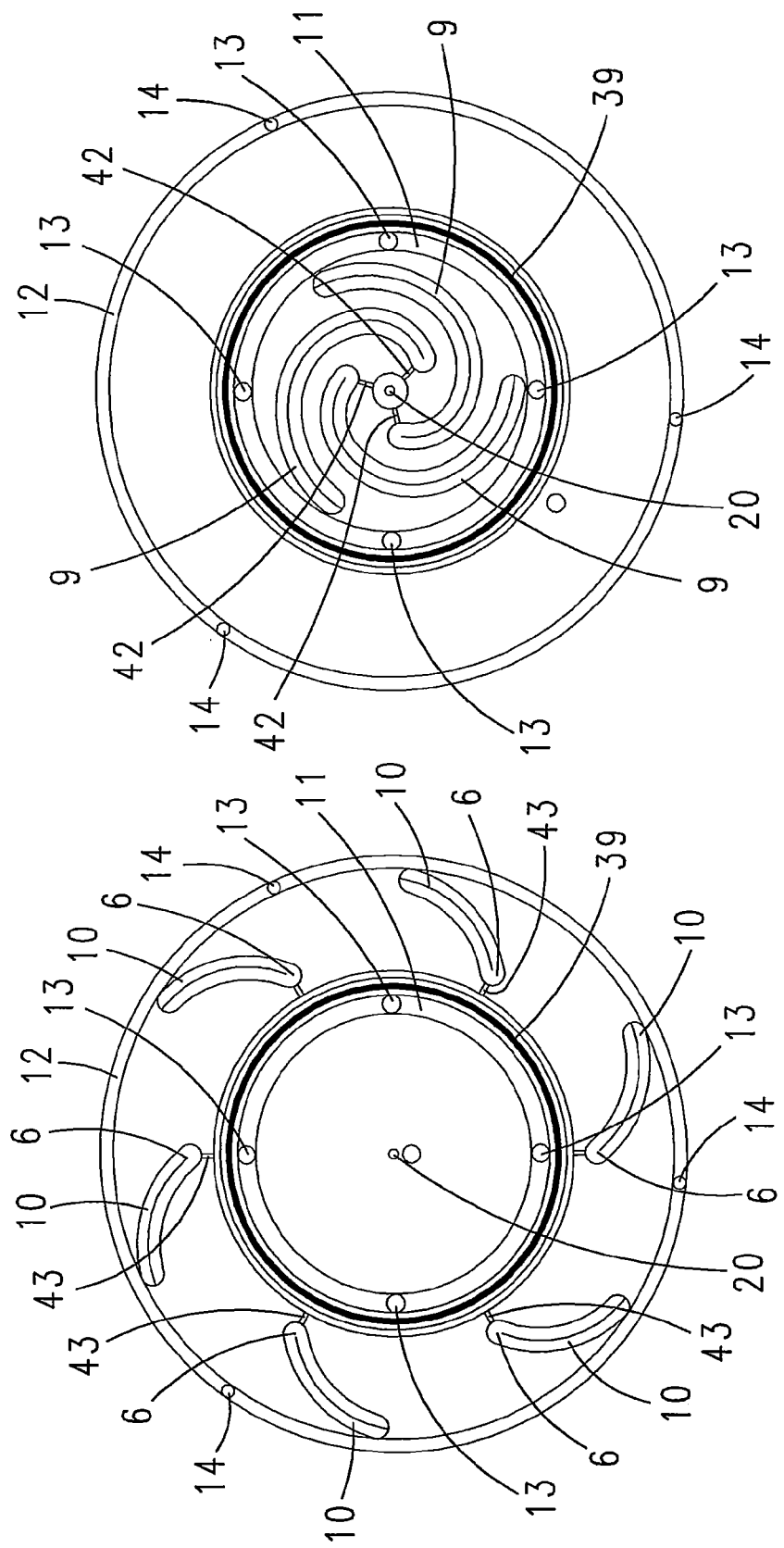

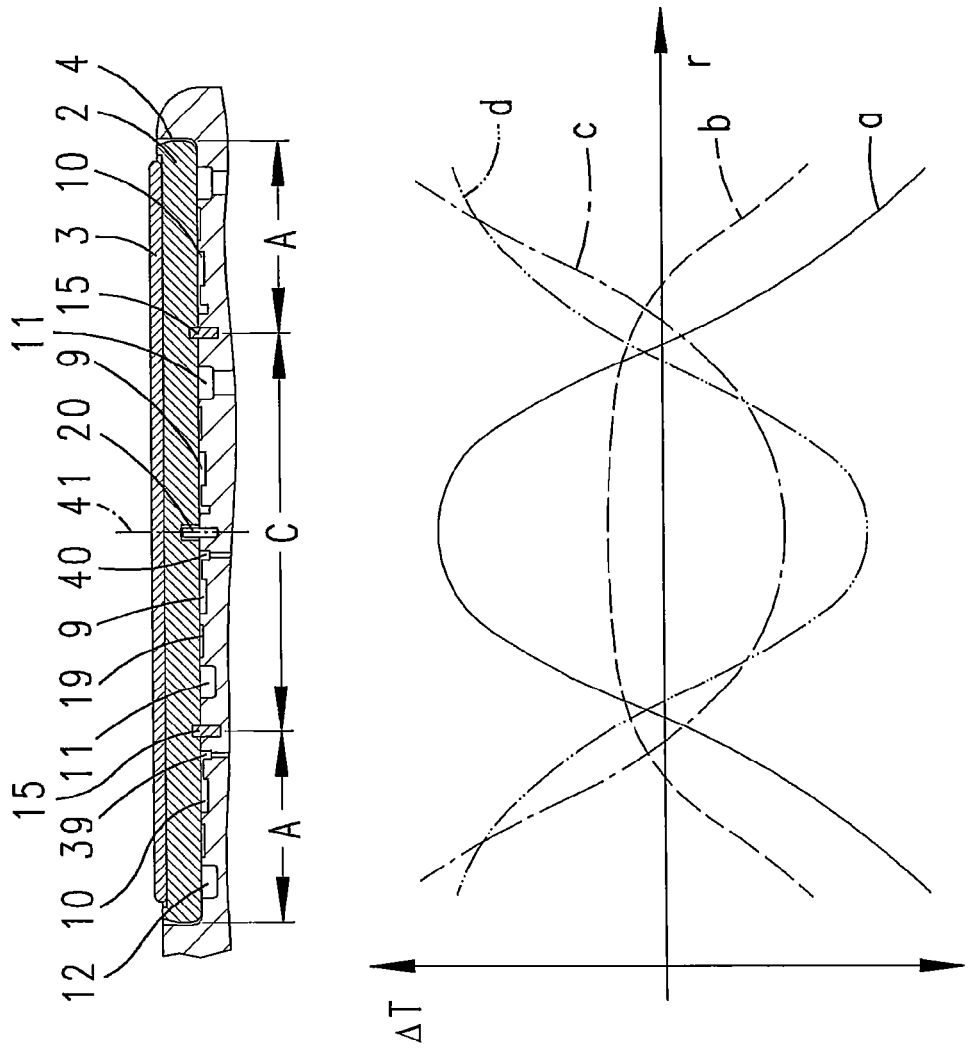

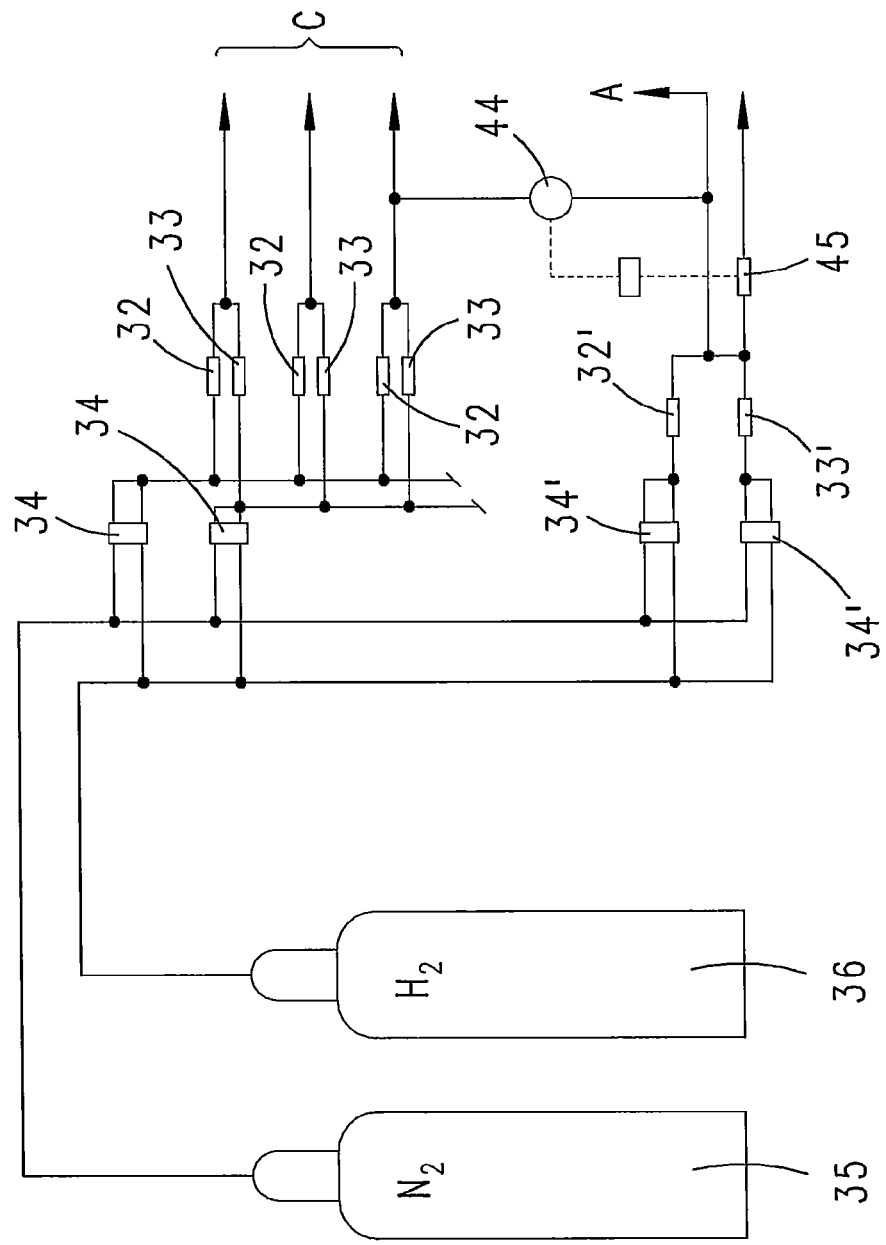

CVD REACTOR HAVING A SUBSTRATE HOLDER RESTING ON A GAS CUSHION COMPRISING A PLURALITY OF ZONES

CROSS REFERENCE TO RELATED APPLICATIONS

This is a NATIONAL STAGE under 35 USC 371 of and claims priority to International Application PCT/EP2010/065105, filed Oct. 8, 2010, incorporated herein by reference, which claims priority to DE 10 2009 044276.6 filed Oct. 16, 2009.

FIELD OF THE INVENTION

The invention relates to a CVD reactor having at least one substrate holder carried, on a dynamic gas cushion, by a substrate holder carrier, the substrate holder being heatable from the rear by a heater.

The invention also relates to a method for temperature control of the surface temperatures of substrate holders that are heated from below, carried on dynamic gas cushions and are in particular driven in rotation.

BACKGROUND

DE 10 2006 018 514 A1 describes a CVD reactor with a reactor housing, a process chamber located in the reactor housing, and a substrate carrier holder forming the base of the process chamber. This has a multiplicity of circular bearing pockets that are arranged in a ring around a center, into which gas supply lines open. Substrate holder carriers, each of which carries a substrate, are enclosed in the pockets. The substrates are coated with III-V semiconductor layers. The starter materials required for this are gaseous and consist e.g. of an organometallic component and a hydride. The starter materials are mixed with a carrier gas in a gas mixing system. The gas mixture arrives into a gas inlet element by way of separate channels, through which the gases are introduced into the process chamber. The process chamber is heated from below. This is effected by an RF heater or a resistance heater. The heat is conducted by heat conduction through the substrate holder carrier that consists of graphite to the surface of the holder facing toward the process chamber. The heat transported to the substrate must for this overcome the barrier of a gap, which is formed by a dynamic gas cushion, on which the substrate holder rests and by means of which it is driven in rotation. The gases introduced into the process chamber, e.g. TMGa or TMIn or TMAl, as well as $A_5H_3$, $NH_3$ or $PH_3$, break down in a pyrolytic manner. The decomposition reactions take place primarily on the hot surface of the process chamber floor and on the surface of the substrate that is heated from below. The growth rate and the composition of the layer or crystal quality depends to a significant extent on the respective local surface temperature. In order to get the highest possible lateral temperature homogeneity, it is proposed by DE 10 2006 018 514 A1 to configure the height of the gap between the base of the bearing pocket and the rear surface of the substrate holder to vary in height, so that thereby the heat flow from the substrate holder carrier to the substrate holder is locally different. By suitable choice of the radial course of the gap height, concave or convex temperature profiles can be established, or even a flat temperature profile.

DE 10 2007 026 348 A1 likewise relates to a CVD reactor with a substrate holder carrier, on the surface of which that faces the process chamber, a multiplicity of substrate holders are arranged, each resting on a dynamic rotary bearing. Each dynamic rotary bearing is connected here to an individual gas supply, so that the gas quality can be individually varied.

DE 100 56 029 A1 relates to a method for temperature control of the surface temperatures of substrates in a CVD reactor. Average values are established from surface temperatures measured at different points. The substrate temperature can be adjusted by the height of the gas cushion. Also, this can be individual for each substrate holder.

A substrate treatment device is known from U.S. Pat. No. 7,156,951 B1, in which the substrate rests on the surface of a substrate holder. The support surface of the substrate holder provides a plurality of shallow grooves that run concentrically with respect to one another, into which there open gas supply lines and from which there leave gas discharge lines. The grooves are acted on by a cooling gas with a varying pressure.

A CVD reactor is known from DE 695 24 640 T2, in which the substrate holder carrier carries three bearing pins, about each of which a disk-shaped substrate holder is rotatably mounted and rests rotatably on a gas cushion.

DD 2 98 435 A5 describes a workpiece carrier that has a multiplicity of openings through which the gas can exit, the gas forming a dynamic gas layer by which heat transfer between the carrier and the workpiece is achieved.

US 2009/0173446 A1 describes a CVD reactor with a substrate holder that has a bearing shell in which a substrate can be bearingly supported on a gas cushion. A multiplicity of gas supply lines open out into the base of the bearing pocket.

US 2003/0033116 A1 describes a heatable substrate holder with two gas supply lines that are separated from one another and gas channels which are arranged on the base of a bearing pocket and fed through the gas supply lines.

U.S. Pat. No. 6,053,982 A describes a CVD reactor with a substrate holder on which the substrates can rest on a gas cushion.

SUMMARY OF THE INVENTION

The invention addresses the problem that in the case of substrate holders for substrates that have a diameter of an inch of more, there arise deformations on the substrates due to temperature gradients perpendicular to the surface. This dishing or curving up of the substrates leads to lateral temperature gradients, since the substrates rest on the substrate holder either only in the central region or in the radially outer region.

As a result of this, the heat transport from the substrate holder to the substrate is non-homogeneous. In order to compensate for this inhomogeneity in the heat transport, there is produced on the substrate holder surface a corresponding concave or convex temperature profile.

It is an object of the invention to provide measures by which a convex or a concave temperature profile can be produced on the surface of the substrate holder.

This object is met by the invention specified in the claims.

Claim 1 provides first and foremost that the gas cushion between the underside of the substrate holder has a plurality of zones that can be fed by individual gas supply lines. The zones are preferably centered concentrically around the axis of rotation of the substrate holder. In the simplest case, the gas cushion consists of two zones, a central zone and an outer zone. However, a plurality of zones can also surround a central zone. The individual zones are separated from one another in such a way that an exchange of gas between neighboring zones is reduced. For this, suitable means are provided between the zones. Preferably the individual zones are separated from one another by means of diffusion barriers. In a coaxial arrangement of the zones, the diffusion barriers are ring-shaped and prevent significant amounts of the gas which is fed into a zone from entering into the neighboring zone. The diffusion barriers may be a reduced-height intermediate zone, a labyrinth seal or even a purged intermediate zone. What is important is that by means of the diffusion barrier, the exchange of gas between two zones that are adjacent to one another is minimized. The cause of a gas exchange of this kind is substantially the diffusion that depends on the e.g. radial length of the diffusion barrier and on its cross-section. Accordingly it is advantageous for the cross-section of the diffusion barrier to be minimized and the length of the diffusion barrier, thus in particular the radial length of the diffusion barrier, to be maximized. A further gas transport mechanism between two zones that neighbor one another is convection or a flow that can be ascribed to a pressure difference between the two zones. In order to avoid a flow of this kind, it is advantageous for the same gas pressure to prevail in the zones that are adjacent to one another. The gases that are introduced into the individual zones are prepared in a gas mixing system. These gases have heat conduction properties that deviate very strongly from each other. There are used in particular nitrogen on the one hand and hydrogen on the other hand, or argon on the one hand and hydrogen on the other hand, or nitrogen on the one hand and helium on the other, as well as argon on the one hand and helium on the other. In the simplest case, a gas is introduced in each case into one of the zones, and the other gas, that has a heat conduction property that is strongly different from the first gas, is introduced into the other zone. The two gas gaps then have different heat transport properties. In this way, the heat transport can be locally affected by the gas gap. Preferably however, mixtures of at least two gases that have a different heat conductivity are introduced into the individual zones. The heat transport through the gas gap can be adjusted by the mixing ratio of the two gases. If e.g. the gas mixture introduced into the central zone has a greater heat conductivity than the gas mixture introduced into the outer zone, the center of the surface of the substrate holder is thus heated more strongly than the periphery, so that the periphery has a lower temperature than the center. On the other hand, the periphery is heated more strongly than the center when there is introduced into the center, a gas mixture that has a heat conductivity which is less than the gas mixture that is introduced into the outer zone. Then the surface in the center is cooler that in the outer region. The heat is generated by a heater which is underneath the substrate holder carrier and heats the substrate holder carrier. Above the upper side of the substrate holder carrier or the substrate holder, there is a process chamber through which there flows, in the vertical direction, a process gas. As is known in principle in the prior art, the process gas is preferably introduced into the process chamber by way of a gas inlet element that is located in the center of the process chamber. The process gases may have the organometallic components mentioned at the beginning and the hydrides mentioned at the beginning. The process chamber is surrounded by a gas outlet element, by means of which decomposition products and the carrier gas may be taken away. The gas outlet element is usually connected to a vacuum pump, in order to be able to set the total pressure in the process chamber in a range between a few millibars and atmosphere pressure. The above-mentioned diffusion barrier is preferably formed by an annular elevation of the bearing surface of the substrate holder carrier. In this way, the cross-section is reduced through which an exchange of gas can take place between the two zones. The bearing surface can be formed by the base of a pocket in which the substrate holder is enclosed. The ring can however also be formed by a graphite or metal body inserted into a groove. The underside of the substrate holder has an annular groove, into which the annular elevation, thus as appropriate the insert ring, can engage. This groove has a wall spacing which is greater that the width of the ring, so that there is formed a sealing gap that changes direction a number of times, in the manner of a labyrinth seal. It is however equally possible to connect the ring fixedly to the underside of the substrate holder and for the groove to be associated with the bases of the pocket. A gas discharge line is associated with the inwardly located zone through which line there can be taken away the carrier gas introduced into the inner zone, which gas may be a mixture of the above-mentioned gases. The discharge line may be a bore which is open toward the underside of the substrate holder carrier. The radially outer zones can also be equipped in each case with gas discharge lines. In a preferred configuration of the invention, each zone, and in particular the inner zone, is provided with a gas collection channel that runs along the edge of the outer zone, and communicates with the gas outlet bore. Moreover, there is a feed channel, into which the gas supply line opens, radially inwardly or in the center of the zone. The feed channel may supply a multiplicity of gas distribution channels that run in particular in the shape of a spiral. The gas flows through these gas distribution channels with a flow direction that is directed circumferentially, so that it not only raises the substrate holder from the bearing surface, but also imposes a rotary momentum on the substrate holder, so that the holder is driven in rotation. These spiral gas distribution channels may be provided in each zone. It is sufficient for only one of the zones to have these gas distribution channels. It is therefore in particular provided that only a radially outwardly lying zone or only a radially inwardly located central zone has the distribution channels required for the rotational drive of the substrate holder. The distribution channels themselves may have different configurations. The CVD reactor according to the invention has a multiplicity of bearing pockets that are disposed around the center of the substrate holder carrier and in which in each case a substrate holder with a substrate is enclosed. Each bearing pocket has an individual gas supply line for each of its zones. Each of these individual gas supply lines may be connected to an individual mixing component of the gas mixing system, so that each zone of each substrate holder can be acted on by an individual gas mixing system. As an alternative to this, the respective central zones and the respective radially outer zones may however also be supplied in common with a gas mixture. In this variant, all central zones receive together a first gas mixture and all radially outwardly located zones receive together a second gas mixture. In order to prepare the gas mixture, a gas mixing system is provided which has a multiplicity of gas sources that are switchable to the individual supply lines by means of valves and which can be adjusted by way of mass flow controllers.

The generic method of temperature control is thus improved by the gas cushion having a plurality of zones into which gases or gas mixtures can be fed that have heat conduction properties that differ from one another and can be adjusted, in particular by changing the gas mixture.

The CVD reactor is preferably served by a gas mixing system, the gas mixing system having gas flow control elements by means of which gases or gas mixtures that are different from one another can be supplied for the individual gas supply lines.

BRIEF DESCRIPTION OF THE DRAWINGS

Embodiments of the invention will be explained below with reference to accompanying drawings, in which:

FIG. 6 shows the detail VI in FIG. 4, enlarged, FIG. 7 shows the gas mixing system in schematic manner, FIGS. 8-13 show various alternatives for the configuration of the base 4' of the bearing pocket 4 in an illustration corresponding to FIG. 5, FIG. 14 shows a schematic illustration of the effect of feeding in gas mixtures of different thermal conductivity into the zones A and C, and FIG. 15 shows another gas mixing system.

DETAILED DESCRIPTION

Figure 1:
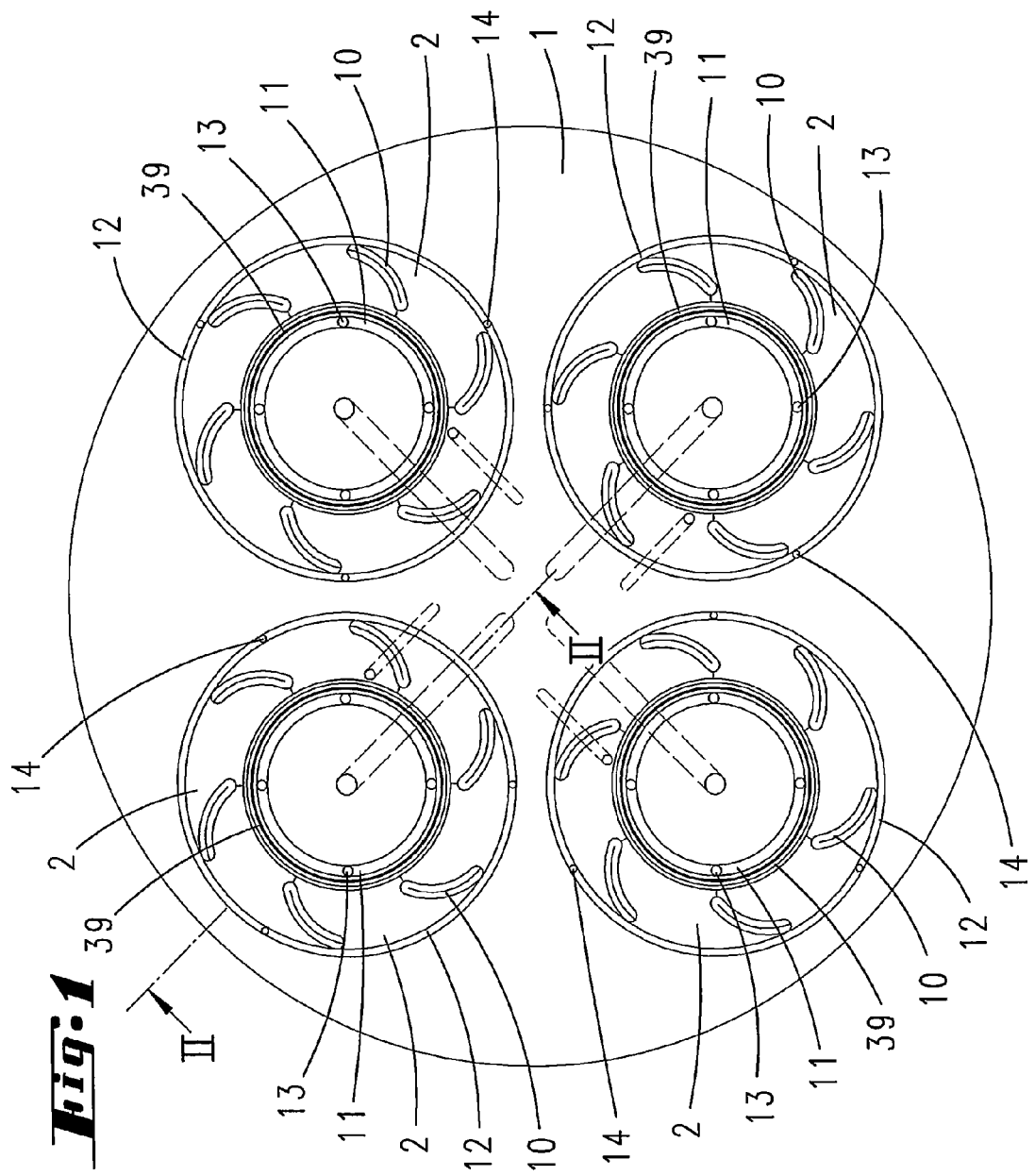
FIG. 1 shows a schematic illustration of a substrate holder carrier 1, in plan view, onto which the substrate holders 2 are disposed.

The CVD reactor consists of a gastight reactor housing 31, not shown in detail, but merely indicated in FIG. 7, consisting in particular of stainless steel, which is connected to a gas mixing system according to FIG. 7 and to a vacuum pump, not illustrated. Within the reactor housing, there is the process chamber 23, which is delimited upwardly by a cover 22, which may consist of quartz or graphite. The process chamber 23 has a radially symmetrical construction and has at its center a gas inlet 21, through which process gases can be introduced into the process chamber 23. The gas inlet 21 is supplied with process gases of the gas mixing system, which may be TMGa, TMIn, TMAl, arsine, phosphine, or methane. In addition, a carrier gas, e.g. hydrogen, nitrogen or a noble gas, is introduced through the gas inlet 21. By means of a vacuum device, not illustrated, the total pressure within the process chamber 23 is kept at a value which is between 1 millibar and atmospheric pressure. Radially outwardly, the process chamber is surrounded by a gas outlet 24, through which the carrier gases and products of decomposition are sucked away.

The base of the process chamber 23 is formed by the upwardly facing surface of a substrate holder carrier 1 and the upwardly facing surfaces of substrate holders 2. The substrates 3 to be coated lie on the substrate holders 2. The center of the base of the process chamber 23 is formed by a central plate 25, beneath which there is, in the exemplary embodiment shown in FIG. 2, a distribution volume 27. The substrate holder carrier 1 is carried by a central carrier 26, through which there run also gas lines 28 and 29.

The underside of the substrate holder carrier 1 is heated by a heater 30. In the exemplary embodiment, this is an RF heater, which produces heat by generation of eddy currents in the substrate holder carrier 1 that consists of graphite.

The above-mentioned supply lines 28, 29 continue into supply lines 7, 8, which open out in the base surface 4' of a pocket 4 of the substrate holder carrier 1 by means of entry openings 5, 6. The supply lines 28, are connected to the gas mixing system by way of external lines 38. Individual gas mixtures flow into the bearing pocket 4 through these lines. in the exemplary embodiment, the gas mixing system has a source 35 for nitrogen, a source 36 for hydrogen and a source 37 for helium. By means of switching valves 34, these gases can be respectively switched at mass controllers 32, 33, by which there can be adjusted individually the gas composition that flows through the entry openings 6, 7 into the bearing pockets at different points. The gases mixed together by the mass controllers 32, 33 consist of two gases having very different thermal conductivity properties, e.g. the gas pairings $N_2$-$H_2$, Ar-$H_2$, $N_2$-He, Ar-He. By adjustment of the gas composition, the heat conductivity property of the gas composition can be adjusted.

The base 4' of the bearing pocket 4 can be structured in different ways. FIGS. 5 and 8 to 13 show examples of this.

For all exemplary embodiments, the base 4' of the bearing pocket 4 is divided into two concentric zones. An inner concentric zone C extends around the center, in which there is an optional centring pin 20 which engages in a centring opening of the substrate holder 2. Around the center 41, a first feed channel 40 is disposed, into which there opens the entry opening 5 of the line 7. The feed channel 40 is connected by way of a narrow connecting channel 42 to a gas distribution channel 9 that runs on a spiral curve. The gas flowing through distribution channel 9 lifts not only the substrate holder 2 into a gap position, but brings the substrate holder 2 also into a rotational movement about the center 41.

In the radially outer region of the zone C, there is a gas collection channel 11 running on a circular line, the channel being connected to a discharge line 13. The discharge line 13 is a vertical bore of large diameter through the substrate holder carrier 1, through which the gas fed in through the entry opening 5 can exit again.

The boundary between the central zone C and the outer annular zone a is formed by a diffusion barrier, the construction of which is to be gathered from FIG. 6. A ring 15 is inserted in a base annular groove 16 of the base 4' of the bearing pocket 4. It projects out of the base 4' and into an annular groove 17 in the rear surface of the substrate holder. The width of the annular groove 17 is greater than the width of the sealing ring 15, so that there results a relatively small sealing gap 18. The sealing gap 18 forms a kind of labyrinth seal between the zones A and C.

In the radially inner region of the zone A, there extends on the base 4' of the bearing pocket 4 a first concentric ring which forms a feed channel 39 and is connected to the entry opening 6. The feed channel 39 is connected by way of connecting channels 43 to gas distribution channels 10 that likewise run on spiral curves. In the radially outer region of the zone A, there is a gas collection channel 12, which is connected to a discharge line 14 of large diameter, which is likewise a vertical bore of large diameter. The gas introduced via the entry opening 6 can escape through the discharge line 14.

The height of the substrate holder 2 corresponds substantially to the depth of the bearing pocket 4, and the substrate holder 2 has a recess on the surface thereof facing toward the process chamber 23, in which recess the substrate 3 is located.

Figure 2:
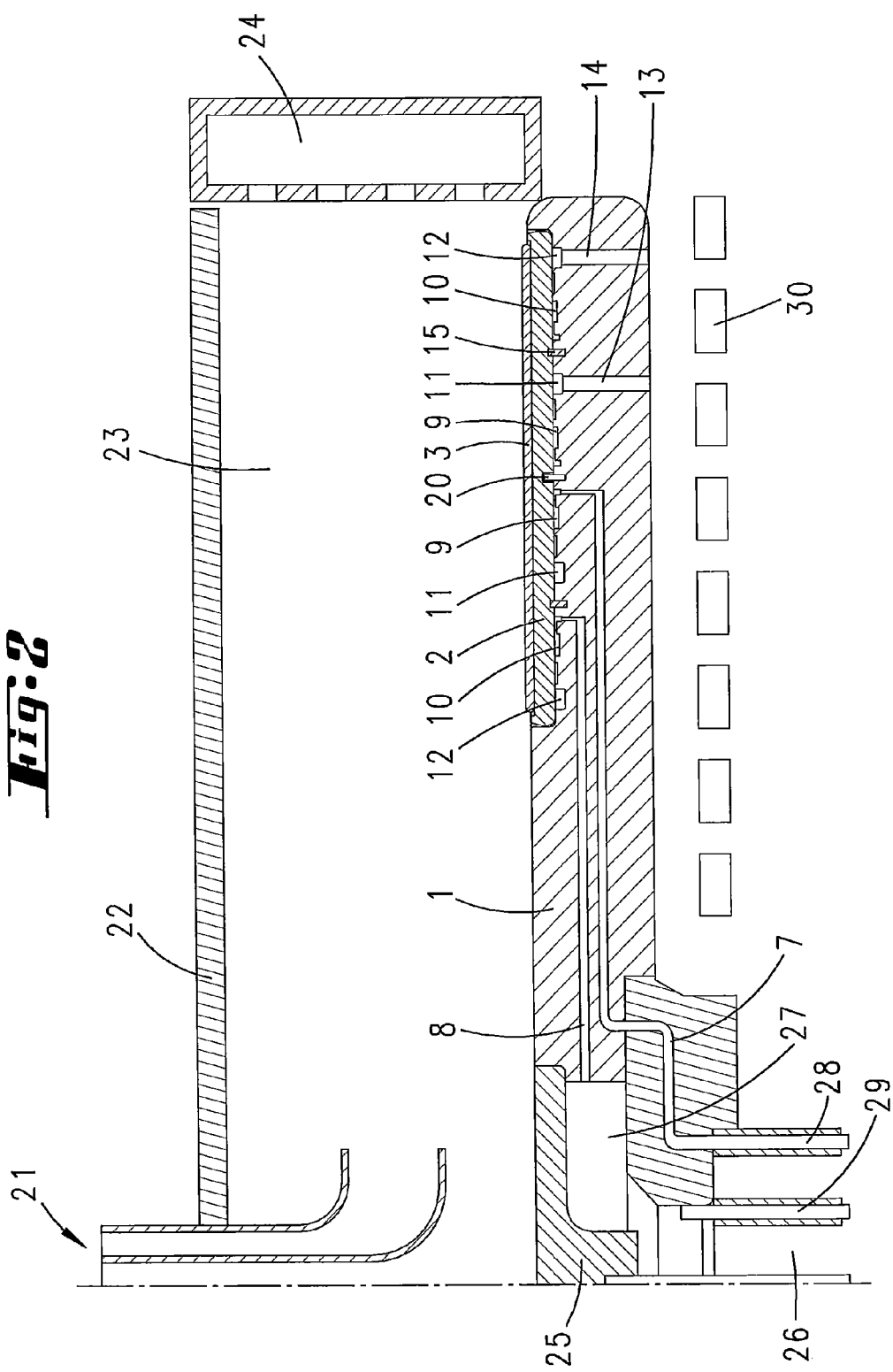
FIG. 2 shows a cross-section on the line II-II in FIG. 1 through half of a substrate holder carrier 1 of a first variant.
Figure 3:
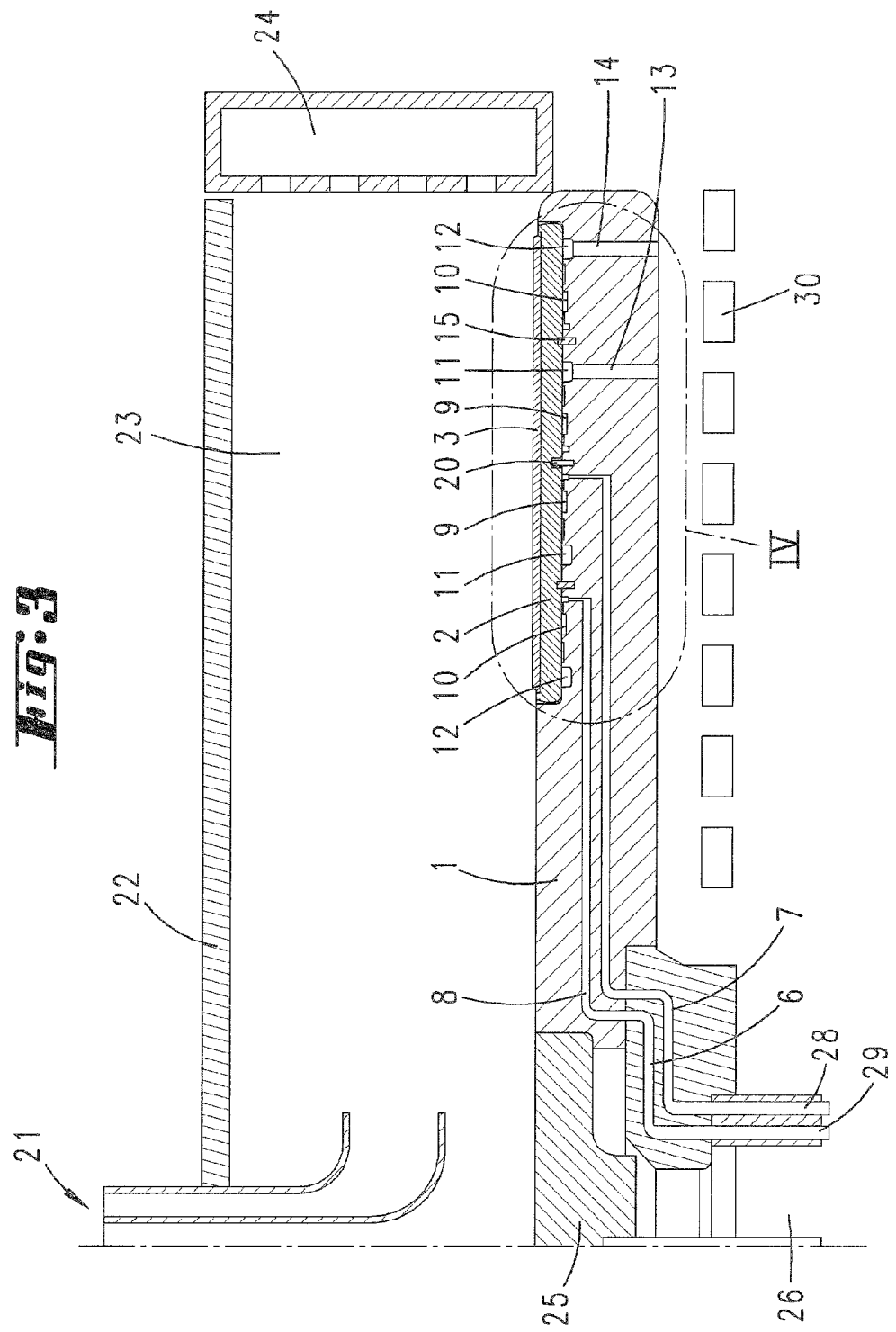
FIG. 3 shows an illustration corresponding to FIG. 2 of a second variant.
Figure 4:
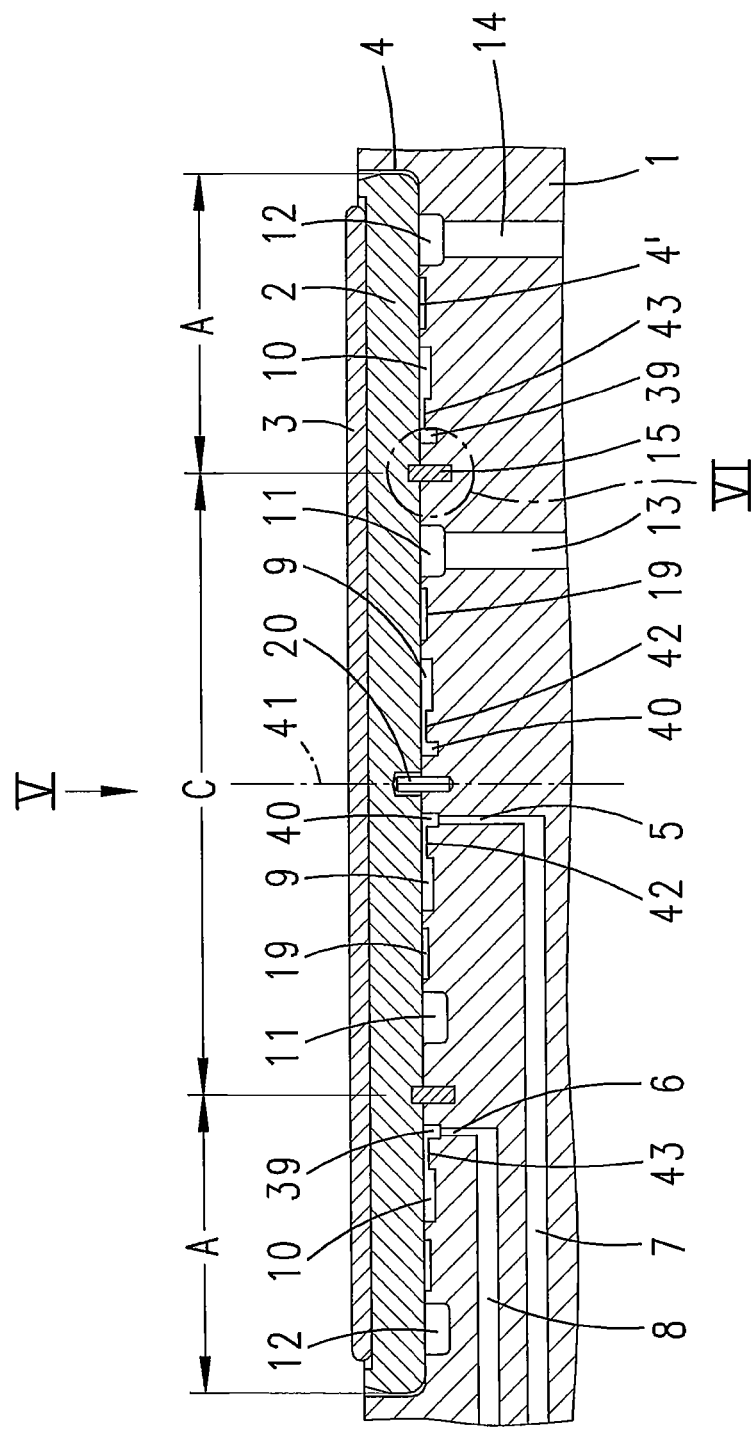
FIG. 4 shows an enlargement of the detail IV in FIG. 3.
Figure 5:
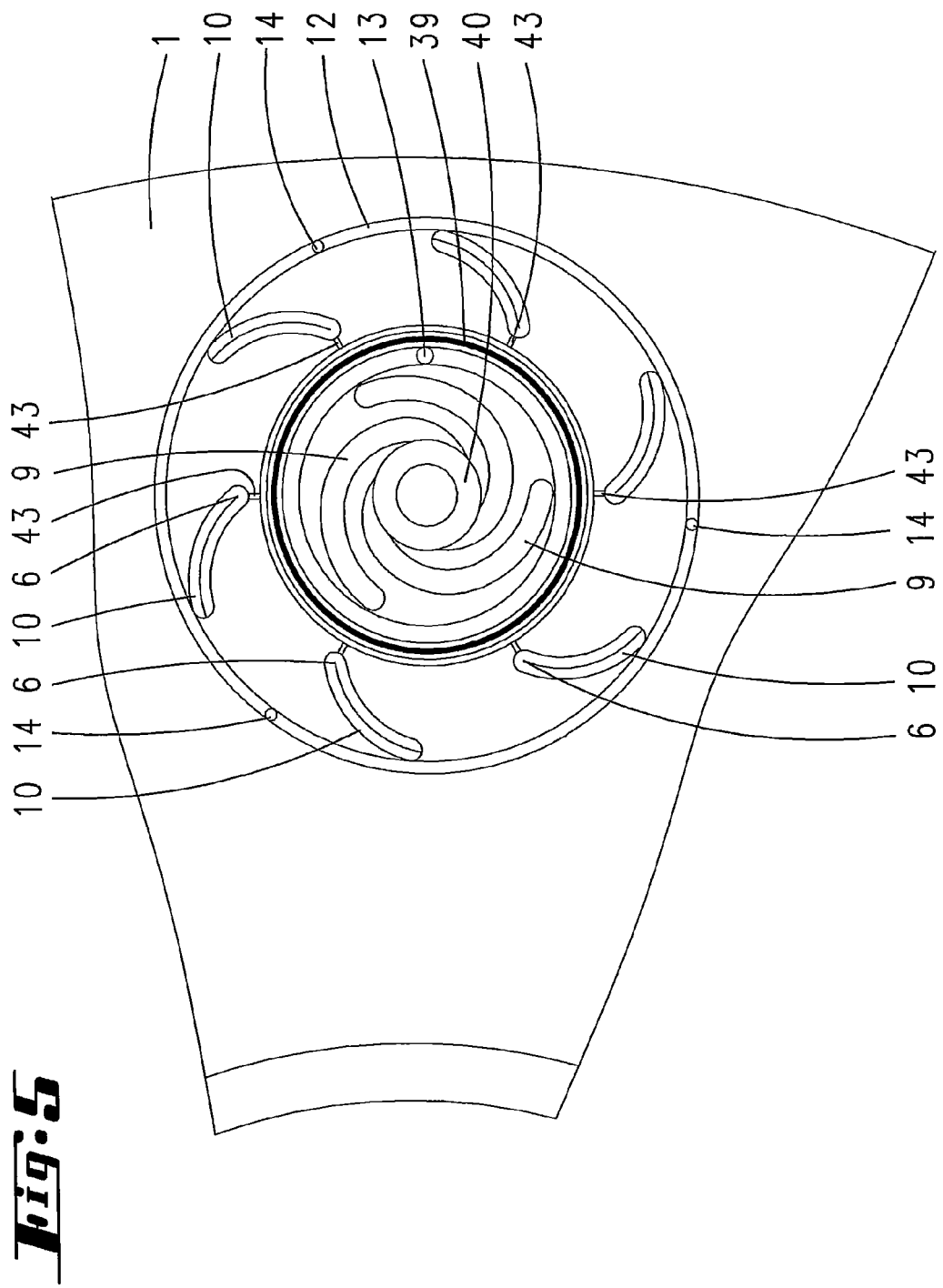
FIG. 5 shows a plan view according to the arrow V in FIG. 4.

In the exemplary embodiment shown in FIG. 2, the supply line 29 opens into a gas distribution chamber 27, by which all feed lines 8, which open into radially outer zones, are fed. The supply lines 28 for the central zone C can be supplied, also in common, with a gas mixture.

In the embodiment illustrated in FIG. 8, there are spiral channels 10 only in the radially outer zone A. In the exemplary embodiment shown in FIG. 9, there are spiral channels 9, 10 both in the inner zone C and in the outer zone A.

In the exemplary embodiment shown in FIG. 10, there are wide spiral channels 10 in the radially outer zone A.

In the exemplary embodiment illustrated in FIG. 11, the radially outer zone A has only one gas channel 10 that runs in the shape of a spiral. FIG. 12 shows, similarly to FIG. 8, gas channels located only in the outer zone A. FIG. 13 shows an exemplary embodiment in which a plurality of gas channels 9 are present only in the central zone C.

The above described device functions as follows:

During a coating process, the edges of the substrate 3 may curve up or turn down, so that either only the center of the substrate or only the edge of the substrate 3 lie flat on the surface of the substrate holder 2. Instead, a gap is present between the substrate 3 and the substrate holder 2 with, in some instances, a locally different gap height.

The quality and the layer thickness of the layers deposited on the substrate 3 depends to a great extent on the surface temperature of the substrate. This latter is dependent on the local heat inflow. The local heat inflow is according to the invention adjusted by controlling the thermal conductivity properties of the gas gap between the base 4' of the bearing pocket 4 and the underside of the substrate holder 2. The gas entering through the inlet openings 5, 6 into the bearing pocket 4 lifts the substrate holder 2 into a spaced gap position, so that a gas cushion 19 is formed. Because of the diffusion barrier 15, there are two separate gas cushions 19, which are built up individually by gases which enter into the gap intermediate space through the entry openings 5, 6. The gas mixtures introduced into the individual zones A, C have different heat conductivities. If for example a gas mixture with a high heat conductivity is introduced into the center zone C and a gas mixture with a low heat conductivity is introduced into the outer zone A, there results on the surface of the substrate holder 2 a temperature profile as is shown schematically in FIG. 14 by a. If the gas introduced into the central zone C has only a slightly greater conductivity than the gas introduced into the outer zone A, there then results the temperature profile indicated in FIG. 14 by b.

If the gas mixture that is introduced into the outer zone A has a greater heat conductivity than the gas mixture that is introduced into the central zone C, there ensues the temperature profile shown in FIG. 14 by c. Differing from the examples a and b, the central region is now not hotter than the peripheral region, but the outer region has a greater surface temperature than the central region. The temperature difference between the central region and the outer region can still be raised by the difference in the heat conductivities of the gas mixtures introduced being increased. By using other mixtures of gases, the temperature profile curves can be controlled not only quantitatively, but also qualitatively, this being indicated e.g. by the temperature profile shown by d.

In the gas mixing system shown in FIG. 15, two gases 35, 36, namely nitrogen and hydrogen, are supplied. The individual gases are delivered via supply lines and changeover valves 34 to mass flow controllers 32, 33. In this exemplary embodiment, three substrate holders are provided, which are in each case supplied separately in the central zone 10 with a mixture of the gases 35, 36. The gas flows are adjusted in appropriate manner by the mass flow controllers 32, 33.

The outer annular zone is supplied with a gas mixture in similar manner via the changeover valves 34' and the mass flow controllers 32', 33'. In this exemplary embodiment, a pressure regulator 44 is provided between a supply line to an inner zone C and the outer zone A. This pressure regulator is a differential pressure sensor, so that a pressure difference in the two zones A and C can be set. The pressure in the supply line to the zone A is moreover set by way of a through-flow pressure regulator 45, which is connected to a vent line.

All features disclosed are (in themselves) pertinent to the invention. The disclosure content of the associated/attached priority documents (copy of the prior application) is hereby also included in full in the disclosure of the application, also for the purpose of incorporating features of these documents in claims of the present application. The subsidiary claims characterize in their selectively subordinated formulation, independent inventive development of the prior art, in particular for the purpose of undertaking divisional applications based on these claims.

LIST OF REFERENCE SIGNS 1 substrate holder carrier
2 substrate holder
3 substrate
4 bearing pocket
4' bearing surface
5 entry opening
6 entry opening
7 supply line
8 supply line
9 gas distribution channel
10 gas distribution channel
11 gas collecting channel
12 gas collecting channel
13 discharge line
14 discharge line
15 sealing ring (diffusion barrier)
16 annular groove
17 annular groove
18 gap
19 gas cushion
20 centring pin
21 gas inlet
22 cover
23 process chamber
24 gas outlet
25 centring plate
26 carrier
27 distribution chamber
28 supply line
29 supply line
30 heater
31 reactor housing
32 mass flow controller
32' mass flow controller
33 mass flow controller
33' mass flow controller
34 switching valve
34' switching valve
35 gas source
36 gas source
37 gas source
38 lines
39 supply channel
40 axis of rotation
41 connecting channel
42 connecting channel 43 connecting channel
44 pressure regulator
45 pressure regulator
A outer concentric zone
C inner circular zone
a temperature profile
b temperature profile
c temperature profile
d temperature profile

What is claimed is:

1. A chemical vapor deposition (CVD) reactor, comprising a process chamber (23) and a substrate holder carrier (1) located therein, the carrier having at least one bearing surface (4'), a plurality of gas supply lines (7, 8) opening into the bearing surface (4'), the carrier supporting a substrate holder (2), a rear side of which faces toward the bearing surface (4'), the bearing surface and the rear side of the substrate holder (2) forming first and second surfaces, respectively, gases fed into a space between the first and second surface through the gas supply lines (7, 8) forming a gas cushion (19) which elevates the substrate holder (2) above the bearing surface (4') and drives the substrate holder (2) into rotation, the CVD reactor characterized in that the gas cushion has a plurality of zones (A, C) that can be individually fed, in each case through an associated one of the gas supply lines (7, 8), the zones being separated from one another by a diffusion barrier formed by a ring (15) that projects above the first surface and engages in an annular groove (17) located on the second surface opposite to the first surface, the annular groove (17) having a wall spacing that is greater than a width of the ring (15), such that there remains between the ring (15) and the annular groove (17) a gap (18), the gap (18) having a narrow gap width which reduces an exchange of gas between the zones (A, C).

2. The CVD reactor according to claim 1, further characterized in that the diffusion barrier (15) surrounds in an annular manner a center of rotation of the substrate holder (2).

3. The CVD reactor according claim 1, further comprising a gas discharge line (13, 14) associated with each of the zones (A, C).

4. The CVD reactor according to claim 3, further characterized in that one of the gas discharge lines (13, 14) communicates with a radially outwardly disposed gas collecting channel (11, 12), which extends in a circumferential direction along an edge of the zones (A, C).

5. The CVD reactor according to claim 1, further characterized in that one of the supply lines communicates with a feed channel (39, 40), which extends, in particular in a radially inwardly located manner, along a peripheral edge of the zones (A, C).

6. The CVD reactor according to claim 1, further characterized in that the substrate holder (2) is enclosed in a pocket (4) of the substrate holder carrier (1), a pocket base of the pocket (4) forming the bearing surface (4'), parallel to which there runs the rear side of the substrate holder (2), on which holder a substrate (3) can be disposed on a side of the holder that faces upwardly in a direction of a cover (22) of the process chamber (23), the pocket base having a feed channel (39, 40) and a gas distribution channel (9, 10) that communicates therewith and runs in a spiral, the gas distribution channel (9, 10) being surrounded by a gas collection channel (11, 12) which communicates with a gas discharge line (13, 14).

7. The CVD reactor according to claim 1, further characterized by a multiplicity of bearing pockets (4) disposed in a circular arrangement around a center of the substrate holder carrier (1), each of the pockets accommodating a substrate holder (2), which is respectively carried by a gas cushion (19) that has a plurality of zones, supply lines being provided for individual ones of the plurality of zones, the supply lines being either connected individually to a gas supply device or to a common gas supply device.

* * * * *